(12) United States Patent
Xie et al.

(10) Patent No.: US 9,412,740 B2
(45) Date of Patent: Aug. 9, 2016

(54) INTEGRATED CIRCUIT PRODUCT WITH A GATE HEIGHT REGISTRATION STRUCTURE

(71) Applicants: GLOBALFOUNDRIES Inc., Grand Cayman (KY); International Business Machines Corporation, Armonk, NY (US)

(72) Inventors: Ruilong Xie, Niskayuna, NY (US); Michael Wedlake, Albany, NY (US); Xiuyu Cai, Niskayuna, NY (US); Ali Khakifirooz, Mountain View, CA (US); Kangguo Cheng, Schenectady, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/855,881

(22) Filed: Sep. 16, 2015

(65) Prior Publication Data
US 2016/0005733 A1   Jan. 7, 2016

Related U.S. Application Data

(62) Division of application No. 14/242,046, filed on Apr. 1, 2014, now Pat. No. 9,165,836.

(51) Int. Cl.
| | |
|---|---|
| H01L 29/78 | (2006.01) |
| H01L 27/088 | (2006.01) |
| H01L 21/8234 | (2006.01) |
| H01L 29/66 | (2006.01) |
| H01L 21/28 | (2006.01) |
| H01L 21/321 | (2006.01) |

(52) U.S. Cl.
CPC ........ *H01L 27/088* (2013.01); *H01L 21/28017* (2013.01); *H01L 21/3212* (2013.01); *H01L 21/823437* (2013.01); *H01L 21/823481* (2013.01); *H01L 29/66545* (2013.01); *H01L 29/7831* (2013.01); *H01L 29/7833* (2013.01)

(58) Field of Classification Search
CPC .................. H01L 2924/12041; H01L 27/088; H01L 29/66545
USPC ......................................................... 257/98
See application file for complete search history.

(56) References Cited

U.S. PATENT DOCUMENTS

| | | | |
|---|---|---|---|
| 2012/0187501 A1 | 7/2012 | Zhu et al. | |
| 2012/0264268 A1* | 10/2012 | Lee | H01L 21/76224 438/289 |
| 2014/0256099 A1* | 9/2014 | Sung | G06F 17/5068 438/257 |

* cited by examiner

*Primary Examiner* — Tran Tran
(74) *Attorney, Agent, or Firm* — Amerson Law Firm, PLLC

(57) ABSTRACT

One illustrative device disclosed includes, among other things, first and second active regions that are separated by an isolation region, first and second replacement gate structures positioned above the first and second active regions, respectively, and a gate registration structure positioned above the isolation region, wherein the gate registration structure comprises a layer of insulating material positioned above the isolation region and a polish-stop layer and wherein a first end surface of the first replacement gate structure abuts and engages a first side surface of the gate registration structure and a second end surface of the second replacement gate structure abuts and engages a second side surface of the gate registration structure.

20 Claims, 19 Drawing Sheets

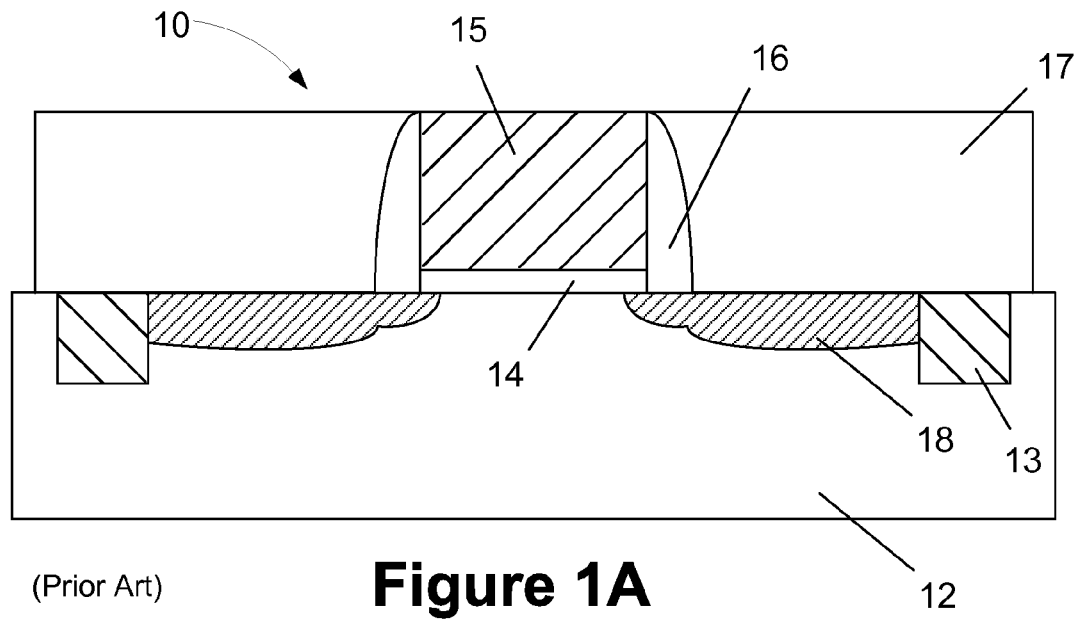
(Prior Art) Figure 1A
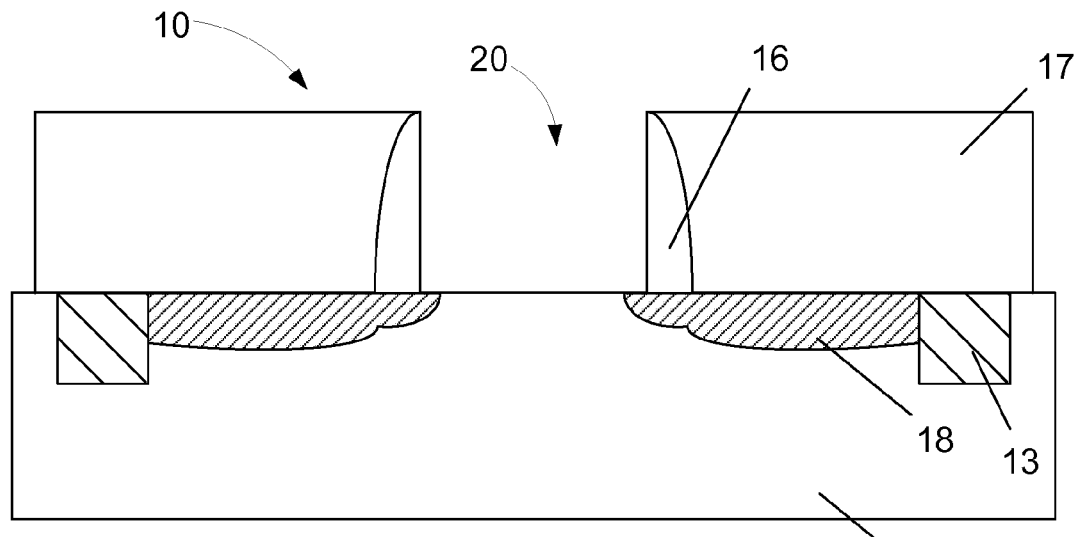
(Prior Art) Figure 1B

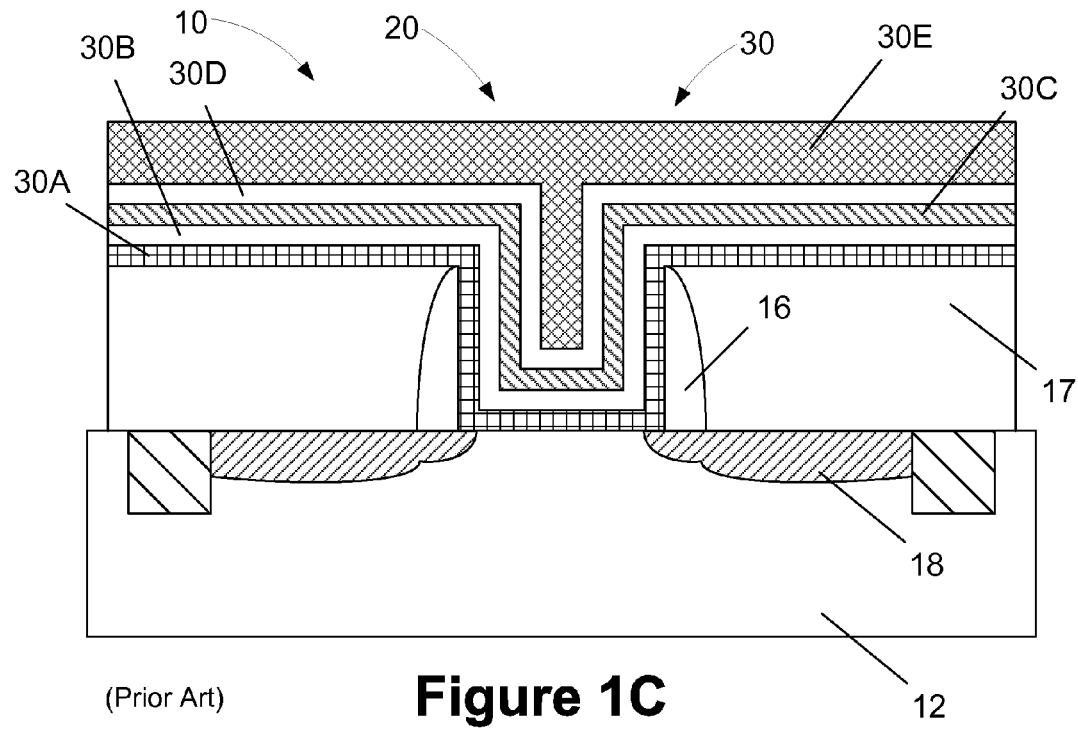
(Prior Art) Figure 1C
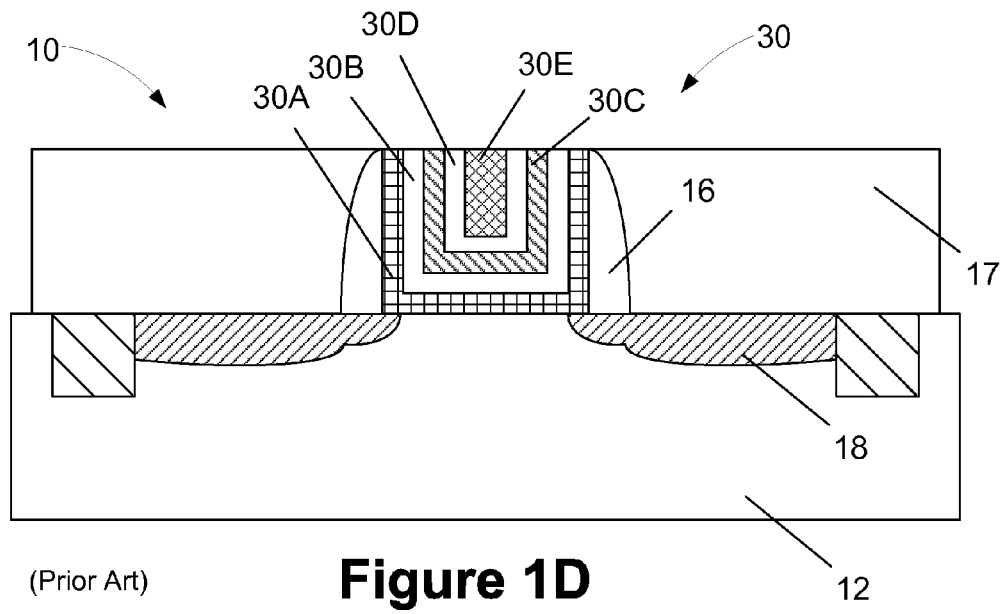
(Prior Art) Figure 1D

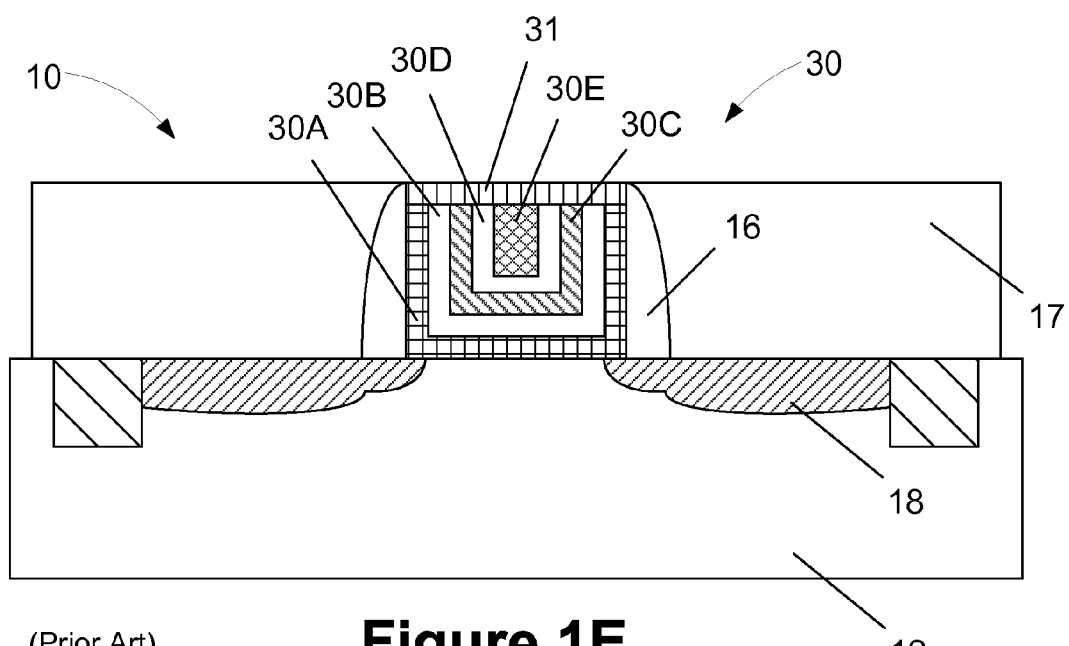
(Prior Art) Figure 1E

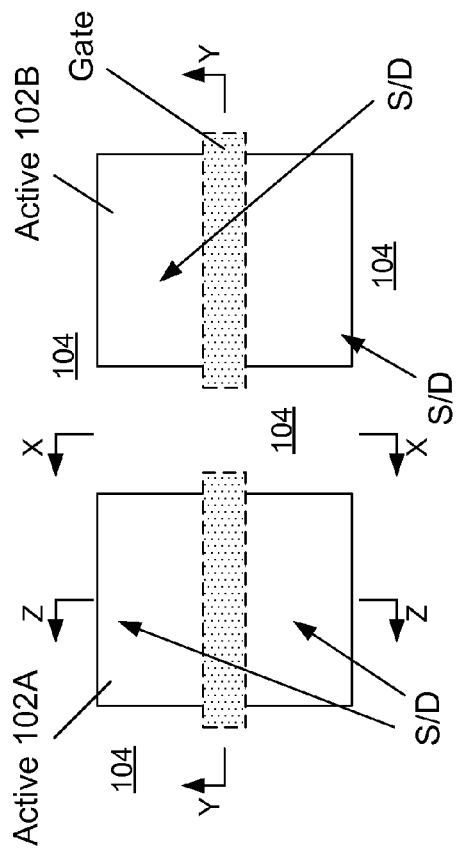
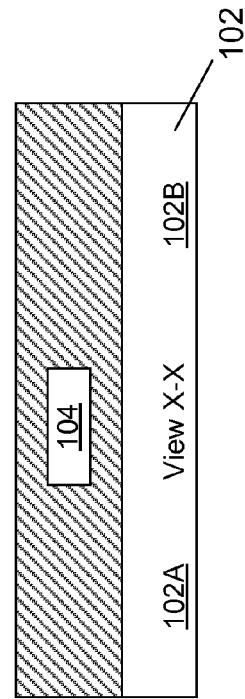
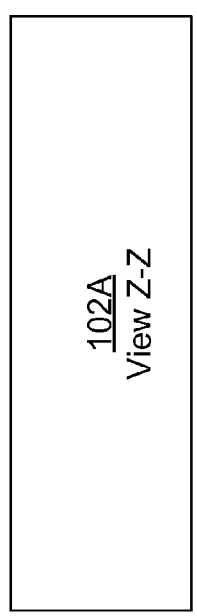
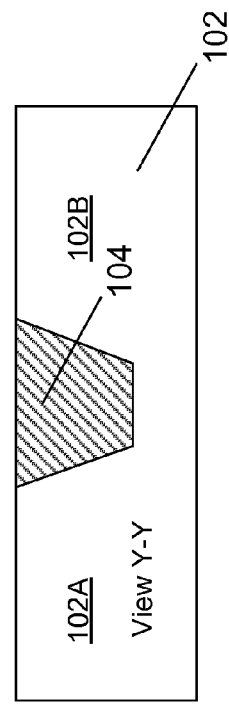
Figure 2A

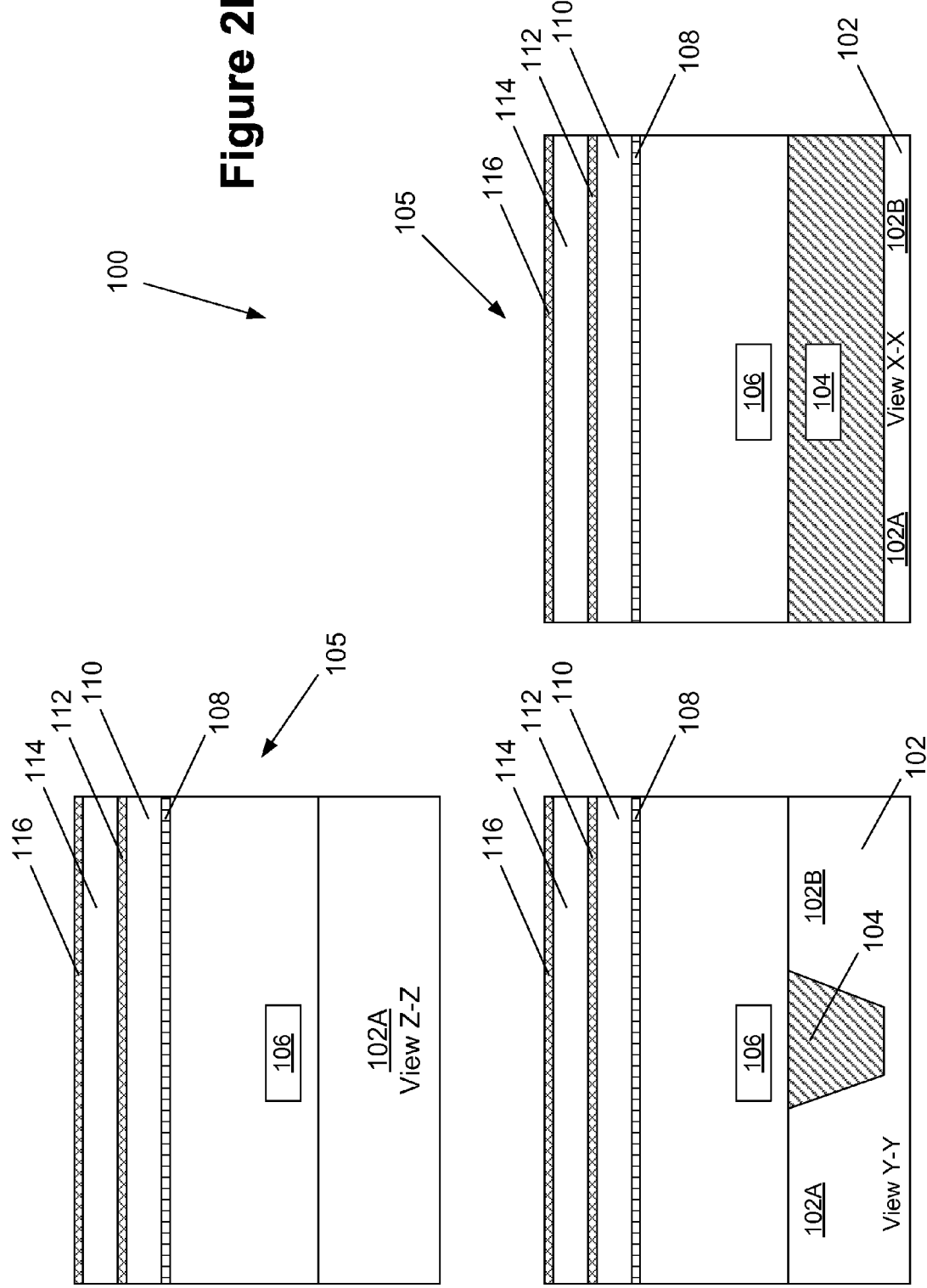

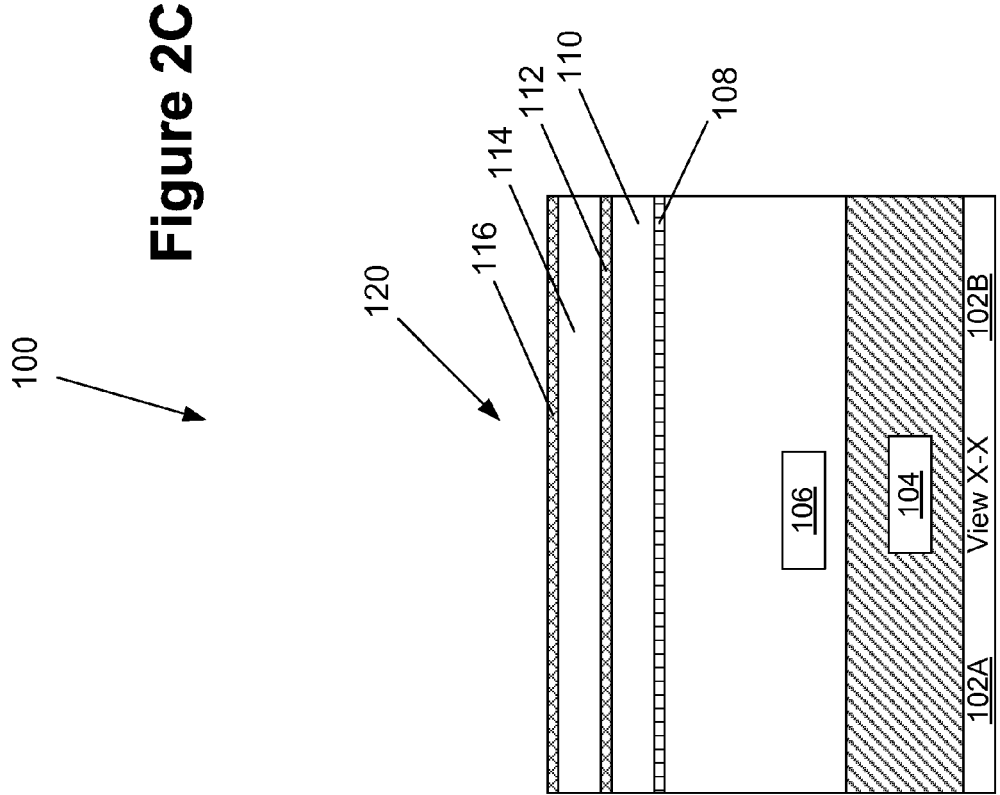
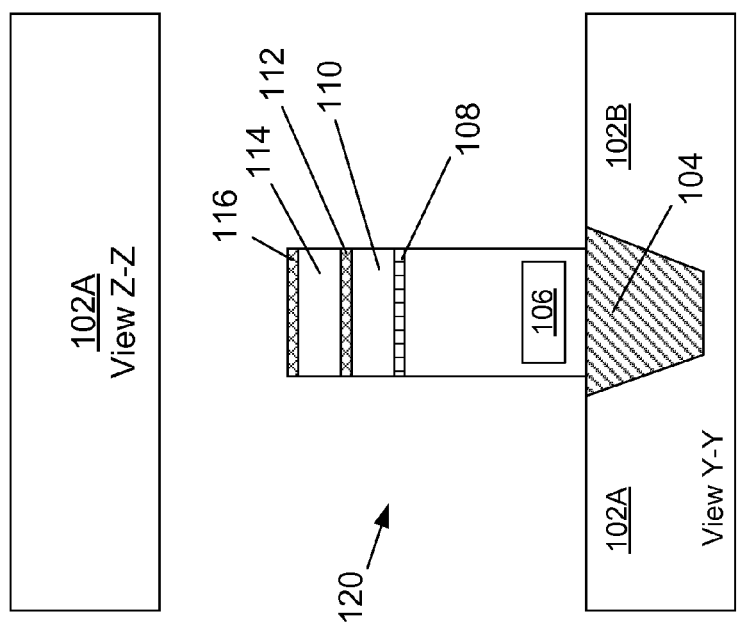
Figure 2C

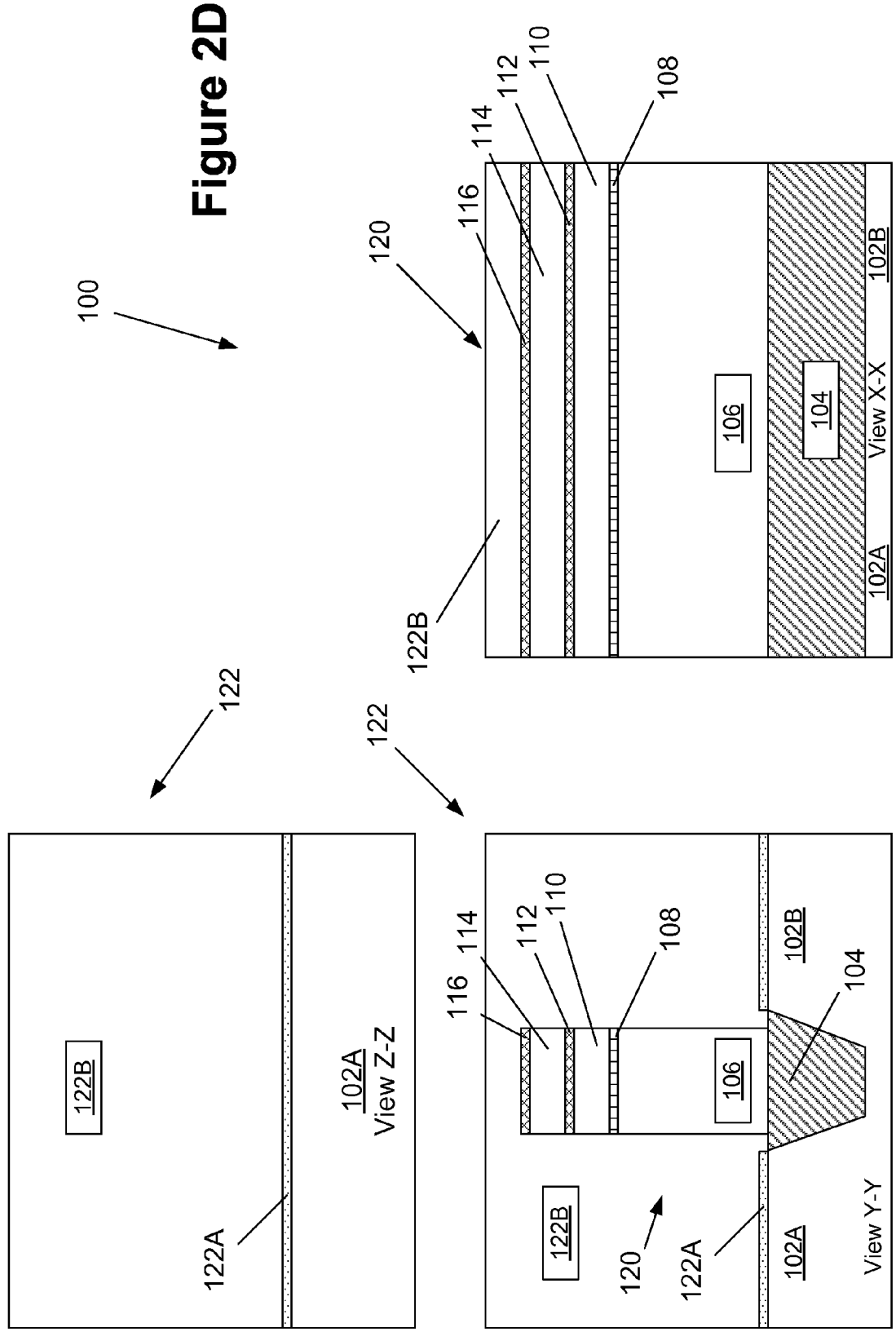

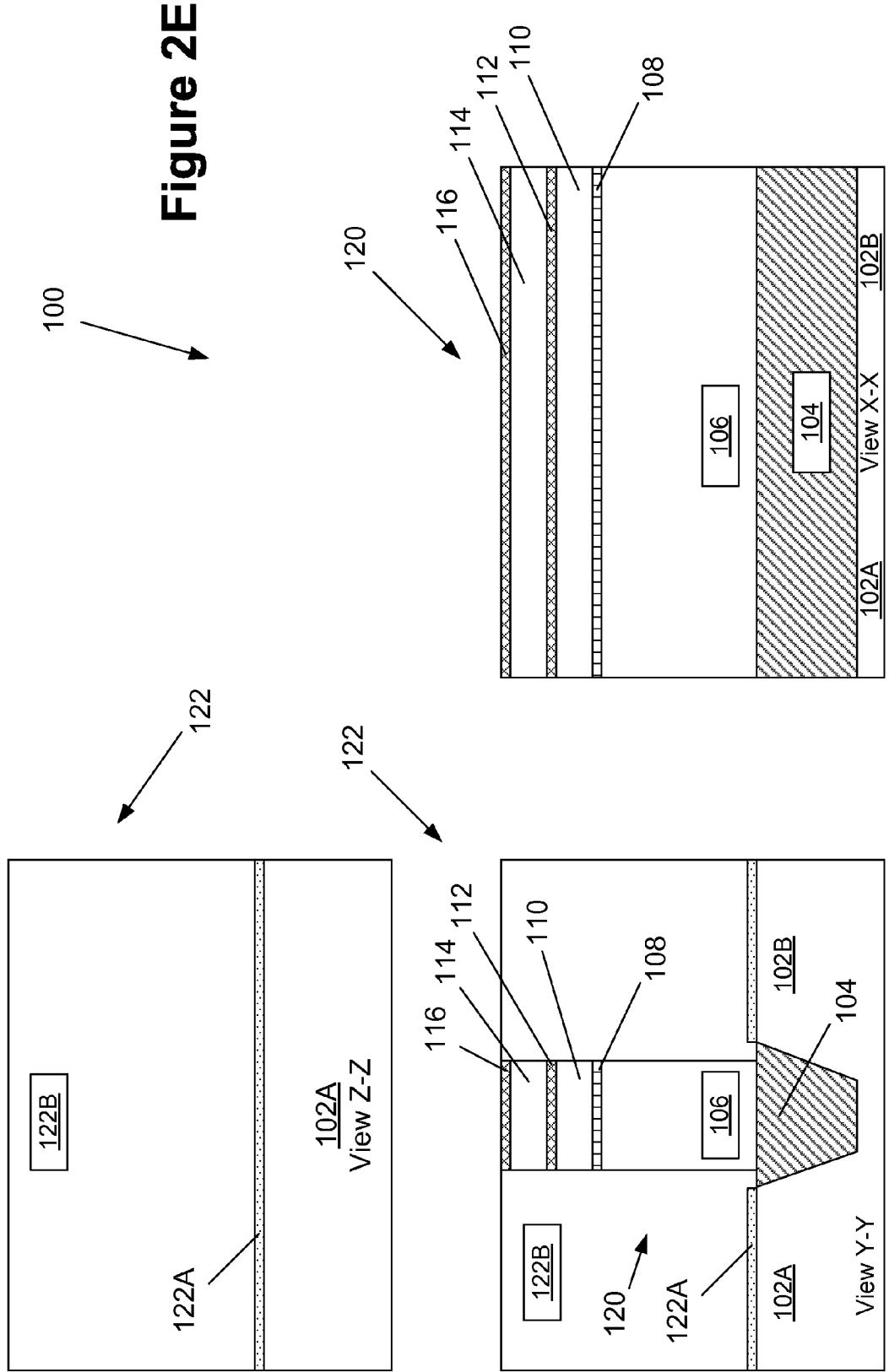

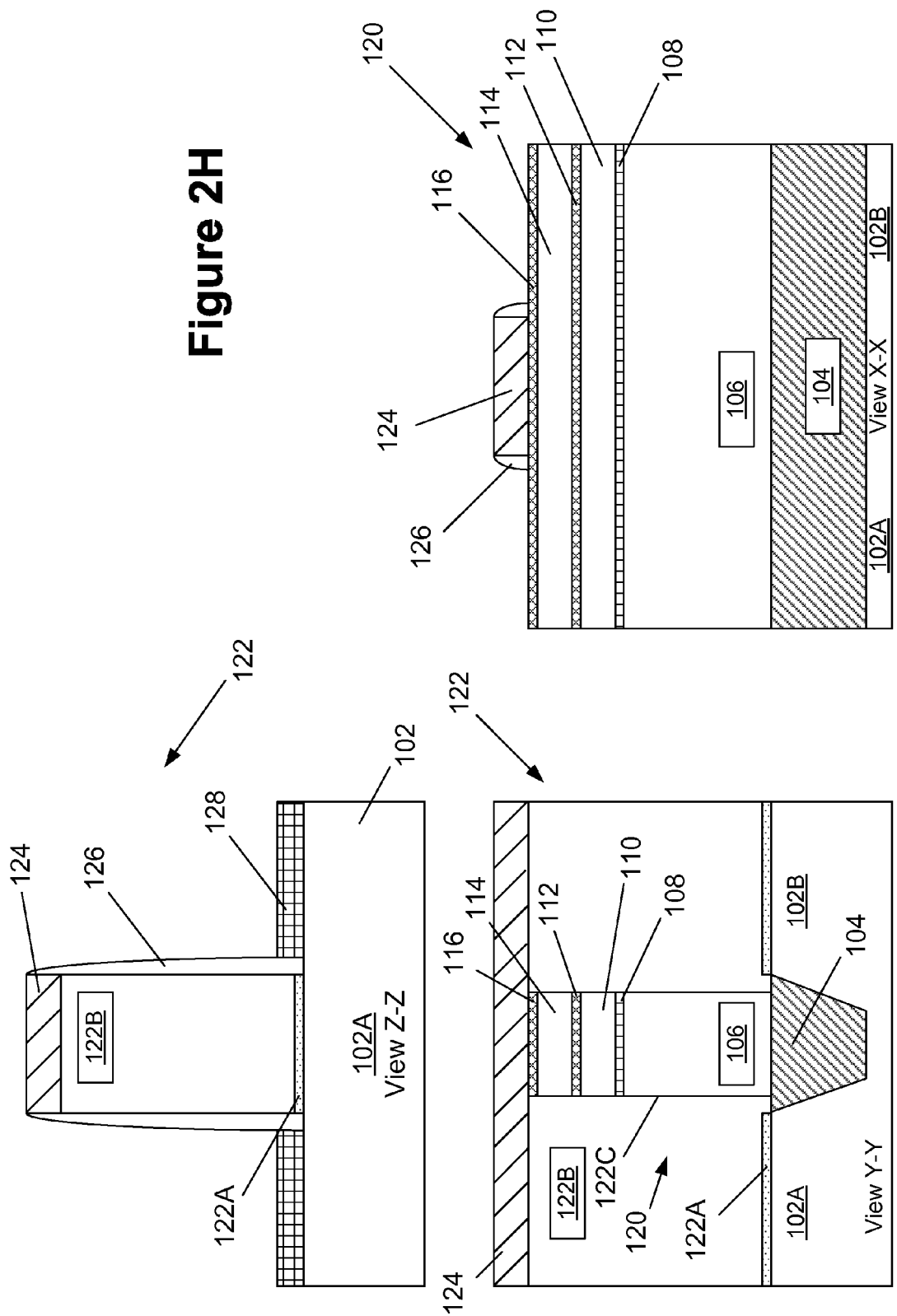

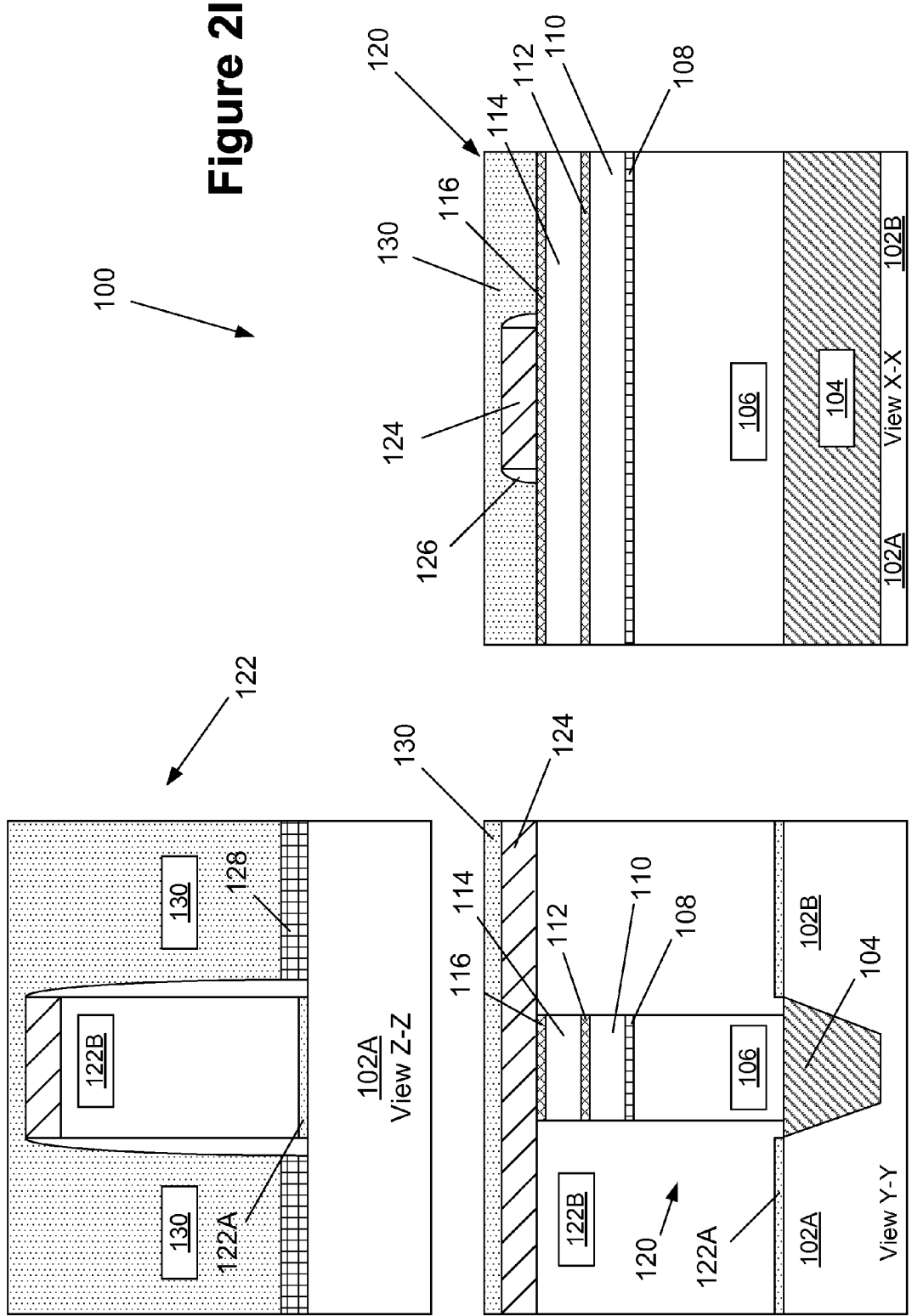

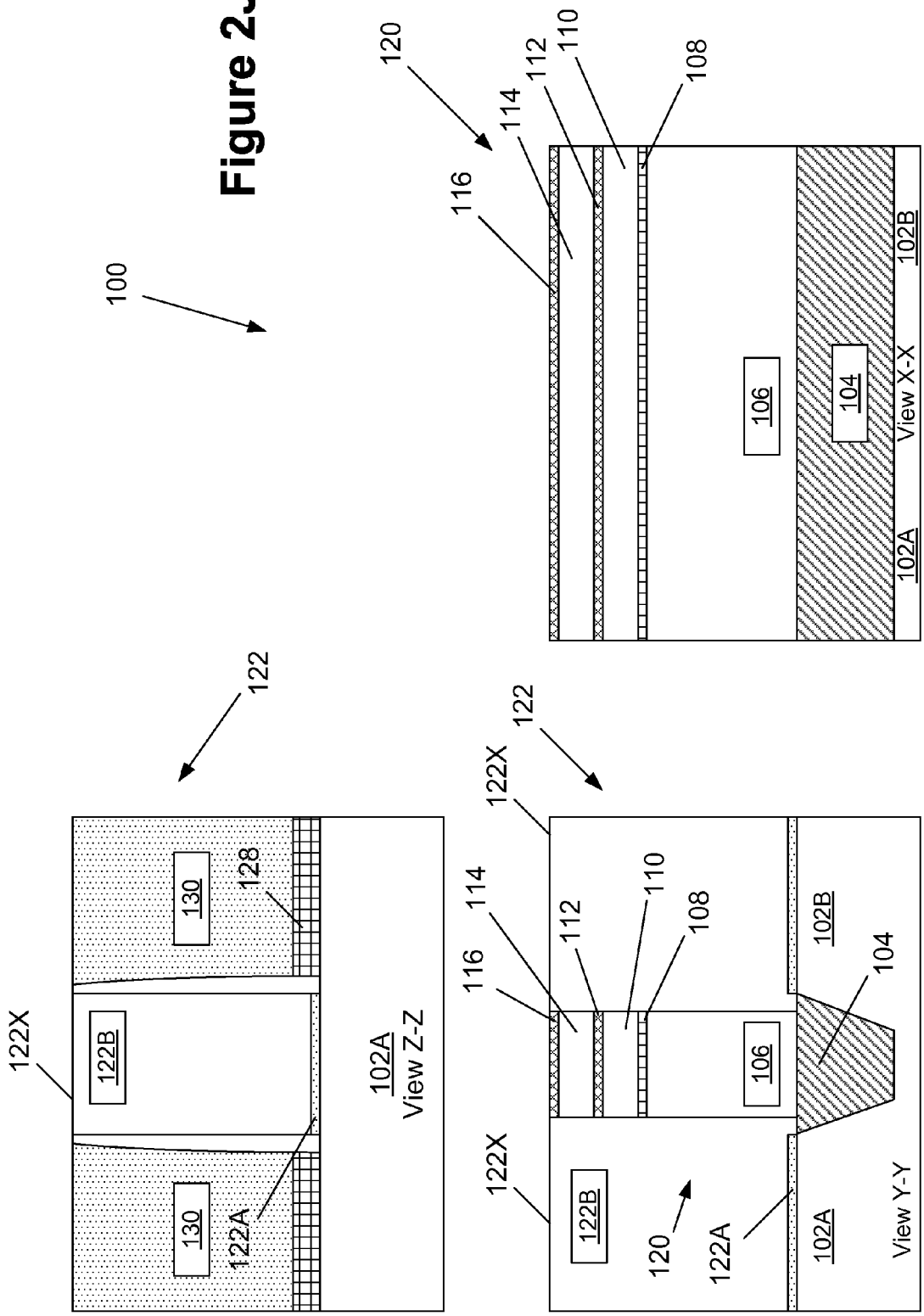

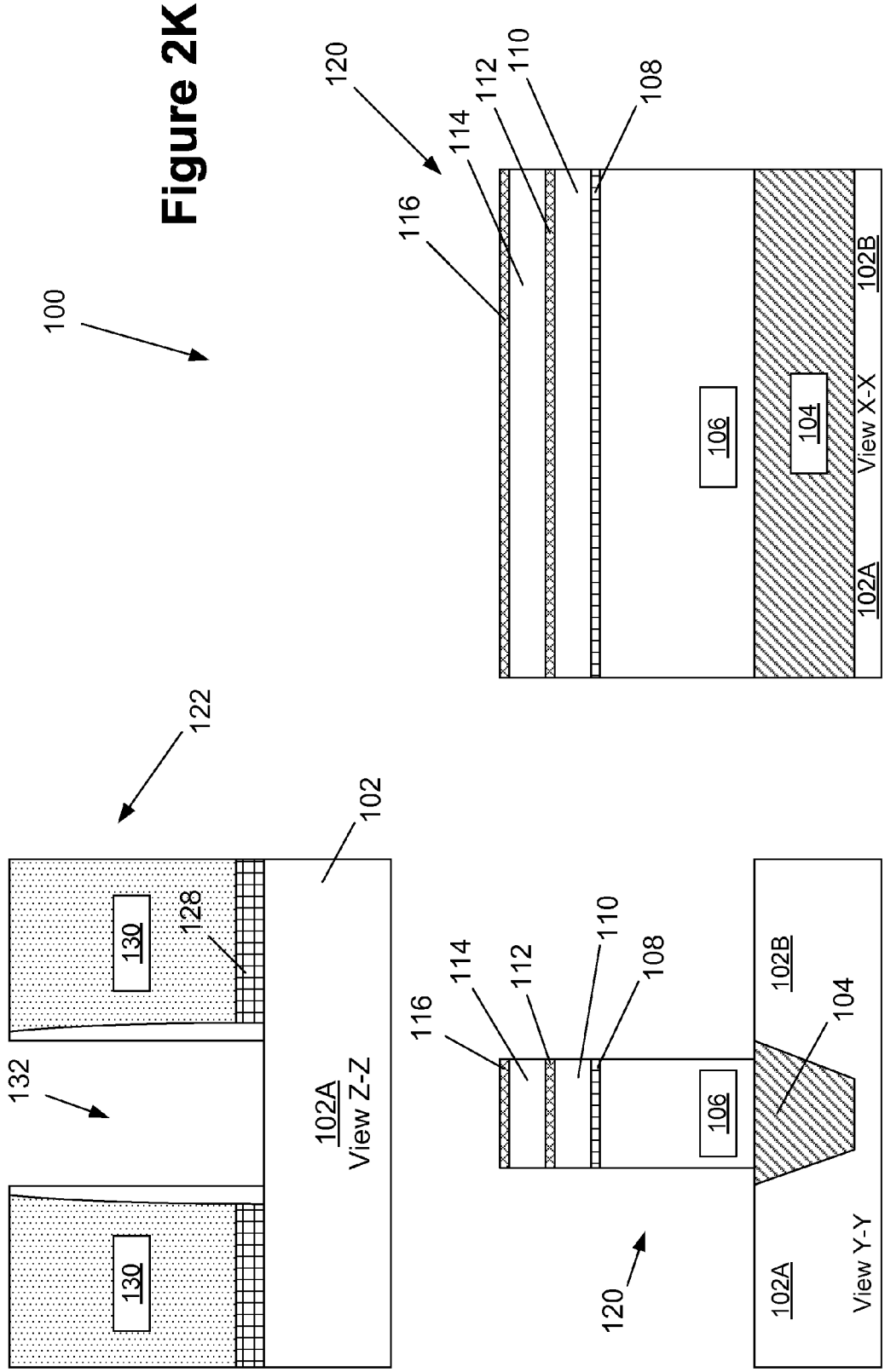

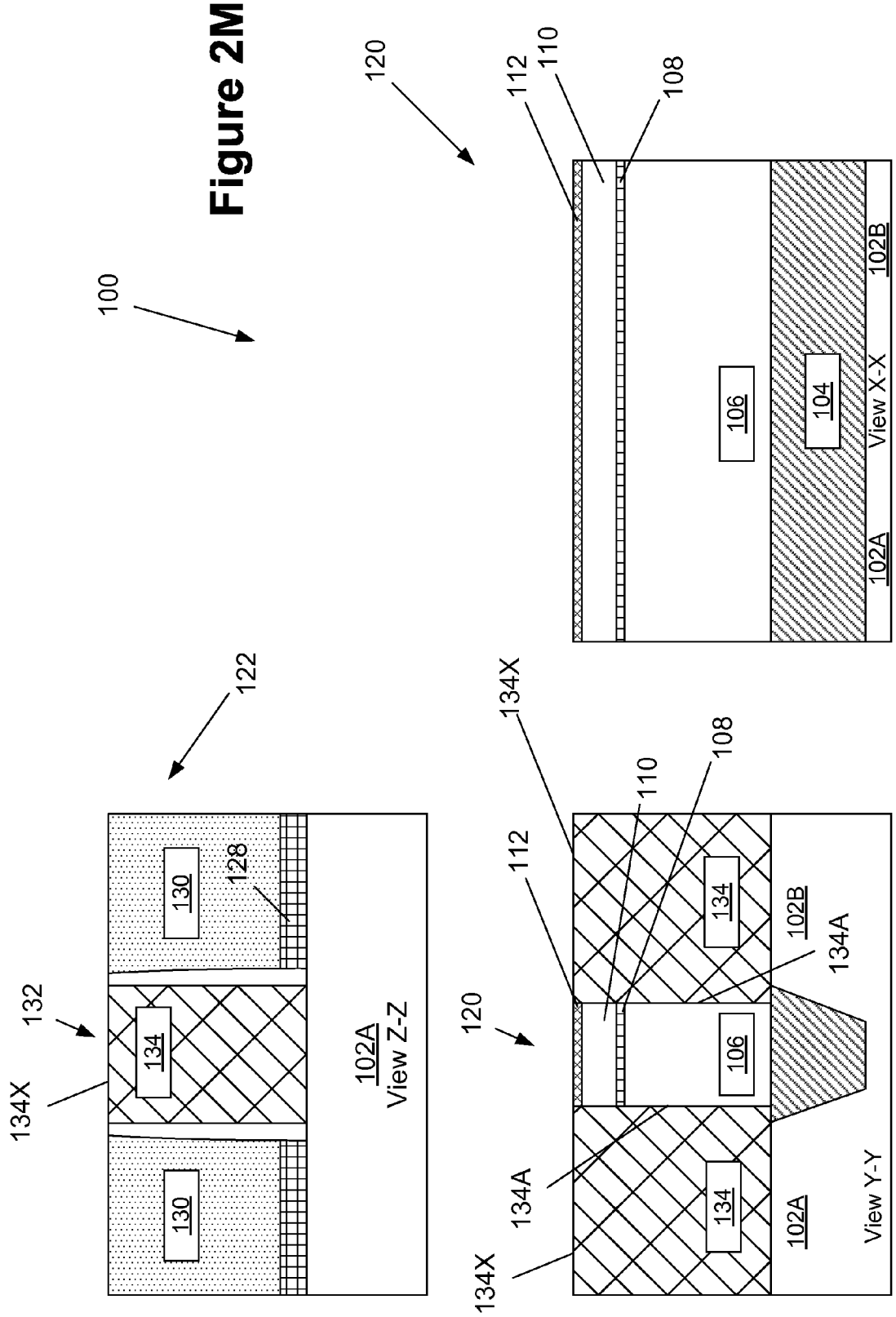

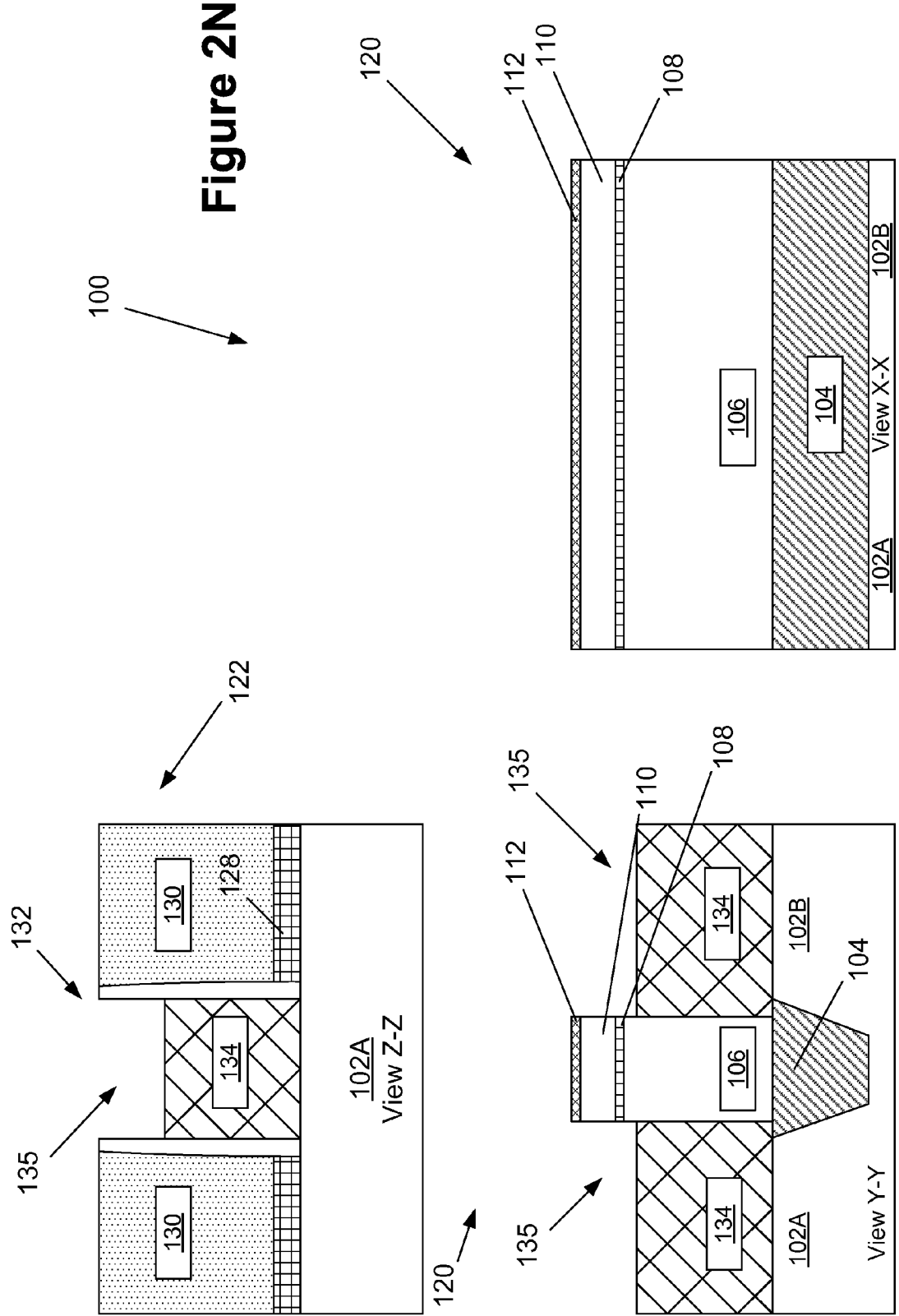

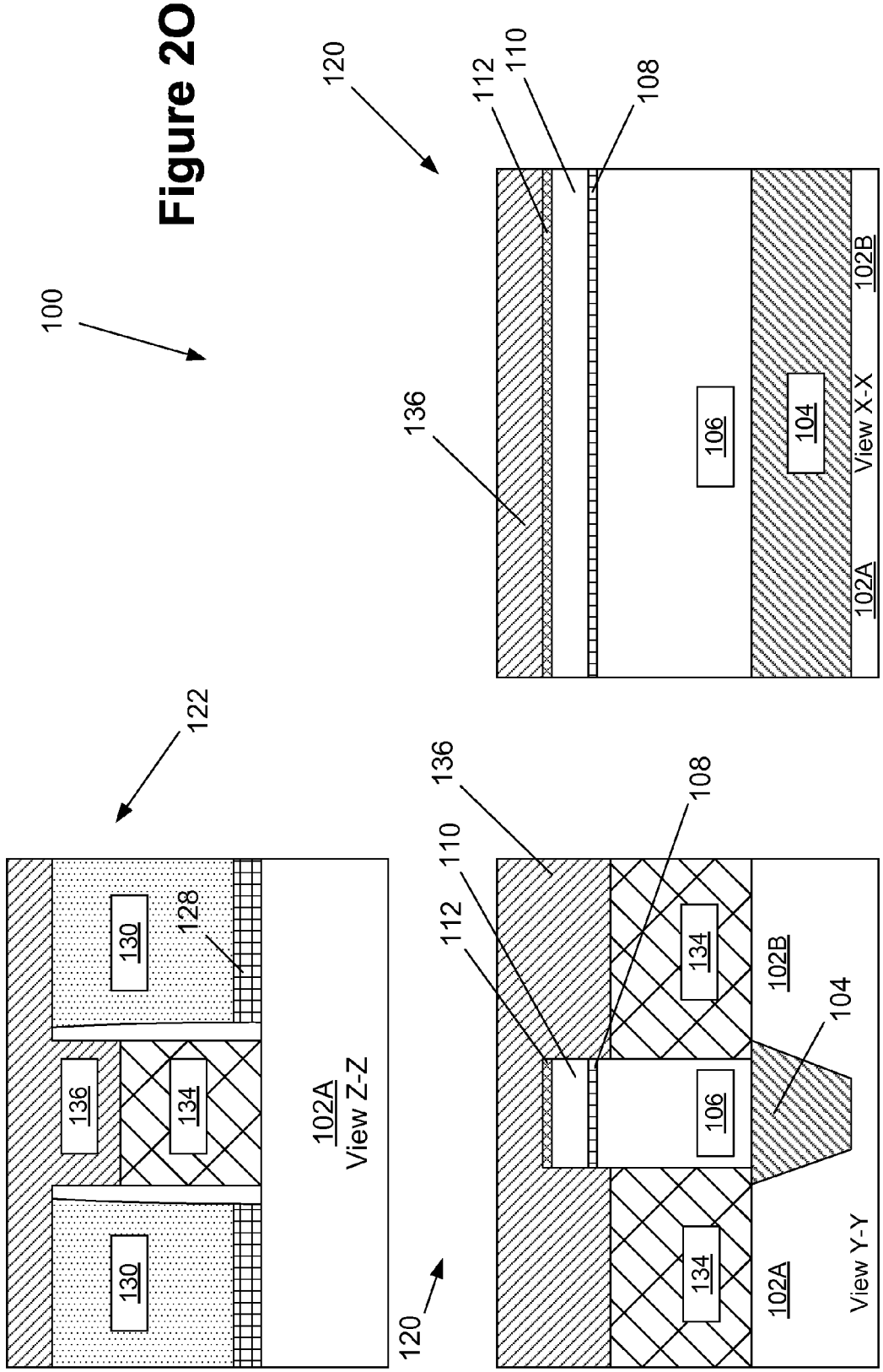

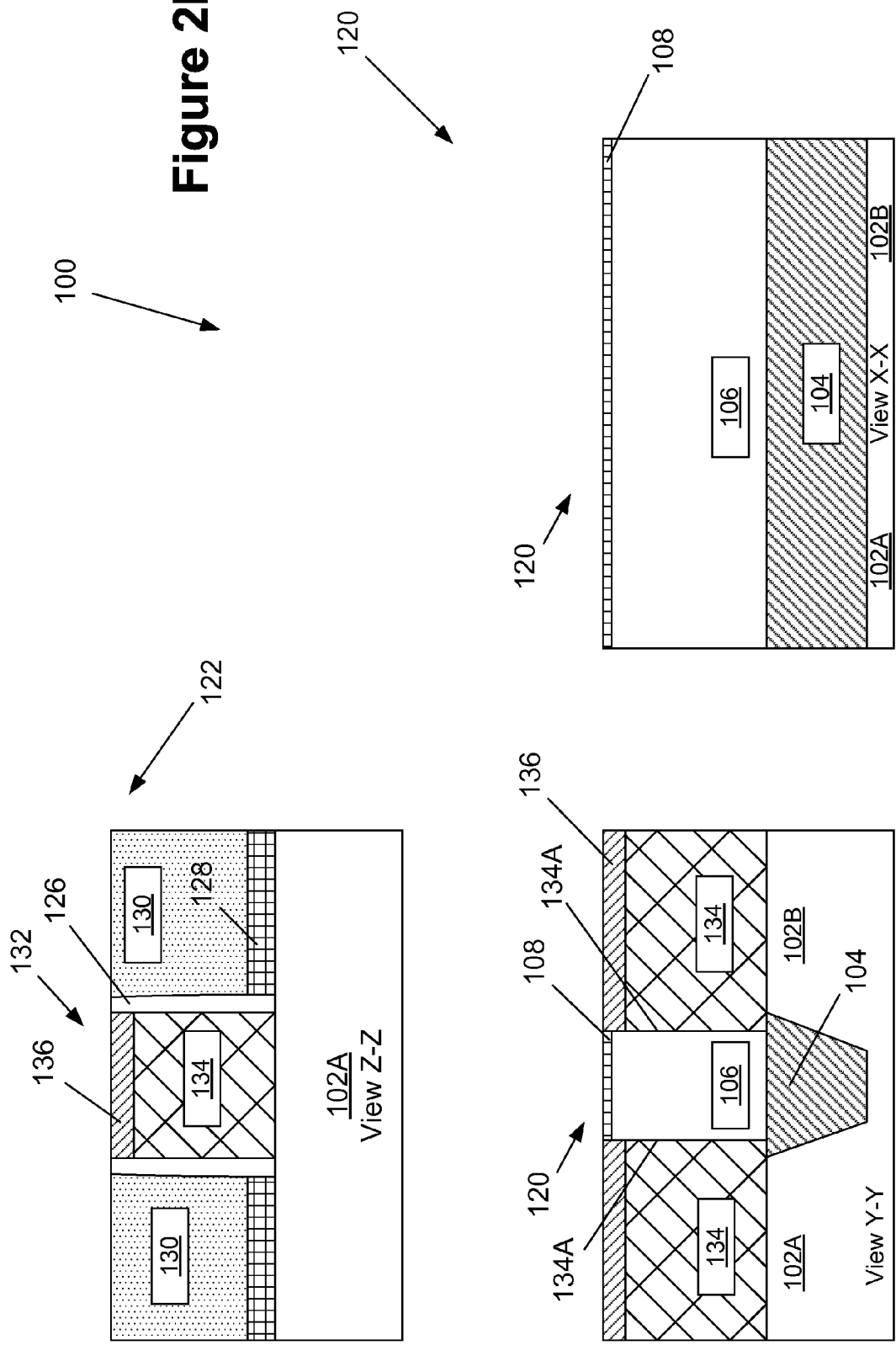

INTEGRATED CIRCUIT PRODUCT WITH A GATE HEIGHT REGISTRATION STRUCTURE

BACKGROUND OF THE INVENTION

1. Field of the Invention

The present disclosure generally relates to the fabrication of integrated circuits, and, more particularly, to various embodiments of an integrated circuit product comprised of a gate registration structure.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source and drain regions that are formed in a semiconducting substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

Immense progress has been made over recent decades with respect to increased performance and reduced feature sizes of circuit elements, such as transistors. However, the ongoing demand for enhanced functionality of electronic devices has forced semiconductor manufacturers to steadily reduce the dimensions of the circuit elements and to increase the operating speed of the circuit elements. The continuing scaling of feature sizes, however, involves great efforts in redesigning the structure of the devices and process techniques and developing new process strategies and tools so as to comply with new design rules. More specifically, to improve the operating speed of FETs, and to increase the density of FETs on an integrated circuit device, device designers have greatly reduced the physical size of FETs over the past decades. That is, the channel length of planar FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel region of a planar FET device from being adversely affected by the electrical potential of the drain region. This is sometimes referred to as a so-called short channel effect, wherein the characteristic of the planar FET as an active switch is degraded.

As noted above, in contrast to a planar FET, which has a substantially planar structure, a so-called FinFET device has a three-dimensional (3D) structure. The basic features of a FinFET device include one or more vertically oriented fins that span the channel region of the device and the source/drain regions, a gate structure positioned around the exposed portions of the fins in the channel region of the device, a gate cap layer positioned above the gate electrode of the gate structure, and sidewall spacers positioned adjacent the gate structure and the gate cap layer. The sidewall spacers and gate cap layer protect the gate structure during subsequent processing operations. The gate structure may be comprised of a layer of insulating material, e.g., a layer of high-k insulating material or silicon dioxide, and one or more conductive material layers (e.g., metal and/or polysilicon) that serve as the gate electrode for the device. As noted above, the fins have a three-dimensional configuration: a height, a width and an axial length. The axial length corresponds to the direction of current travel in the device when it is operational. The portions of the fins covered by the gate structure are the channel regions of the FinFET device. In a conventional process flow, the portions of the fins that are positioned outside of the spacers, i.e., in the source/drain regions of the device, may be increased in size or even merged together by performing one or more epitaxial growth processes to form epi semiconductor material on the portions of the fins in the source/drain regions of the FinFET device. The process of increasing the size of or merging the fins in the source/drain regions of the FinFET device is performed for various reasons, e.g., to reduce the resistance of source/drain regions and/or to make it easier to establish electrical contact to the source/drain regions, etc. Even if an epi "merge" process is not performed, an epi growth process will typically be performed on the fins in the source/drain regions of the device to increase their physical size. In a FinFET device, the gate structure may enclose both sides and the upper surface of all or a portion of the fins to form a tri-gate structure so as to result in a channel having a three-dimensional structure instead of a planar structure. In some cases, an insulating cap layer, e.g., silicon nitride, is positioned at the top of the fins and the FinFET device only has a dual-gate structure (fin sidewalls only).

Thus, unlike a planar FET, in a FinFET device, a channel is formed perpendicular to the upper surface of the semiconducting substrate, thereby reducing the physical size of the FinFET device. Also, in a FinFET device, the junction capacitance at the drain region of the device is greatly reduced, which tends to significantly reduce short channel effects. When an appropriate voltage is applied to the gate electrode of a FinFET device, the surfaces (and the inner portion near the surface) of the fins, i.e., the vertically oriented sidewalls and the top upper surface of the fin (for a tri-gate device), form a surface inversion layer or a volume inversion layer that contributes to current conduction. In a FinFET device (tri-gate), the "channel-width" is estimated to be about two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current density than planar FET devices. Additionally, the leakage current of Fin- FET devices after the device is turned "OFF" is significantly reduced as compared to the leakage current of planar FETs, due to the superior gate electrostatic control of the "fin" channel on FinFET devices. In short, the 3D structure of a FinFET device is a superior structure as compared to that of a planar FET, especially in the 20 nm CMOS technology node and beyond. The gate structures for such FinFET devices may also be manufactured using so-called "gate-first" or "replacement gate" (gate-last) manufacturing techniques.

For many early device technology generations, the gate structures of most transistor elements (planar or FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate structure—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1A-1E simplistically depict one illustrative prior art method for forming an HK/MG replacement gate structure using a replacement gate technique on a planar transistor device. As shown in FIG. 1A, the process includes the formation of a basic transistor structure above a semiconductor substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1C, various layers of material that will constitute a replacement gate structure 30 are formed in the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1E depicts the device 10 after several process operations were performed. First, one or more recess etching processes were performed to remove upper portions of the various materials within the cavity 20 so as to form a recess within the gate cavity 20. Then, a gate cap layer 31 was formed in the recess above the recessed gate materials. The gate cap layer 31 is typically comprised of silicon nitride and it may be formed by depositing a layer of gate cap material so as to over-fill the recess formed in the gate cavity and thereafter performing a CMP process to remove excess portions of the gate cap material layer positioned above the surface of the layer of insulating material 17. The gate cap layer 31 is formed so as to protect the underlying gate materials during subsequent processing operations.

Unfortunately, typical process flows that are performed in manufacturing gate structures using replacement gate techniques can lead to gate structures exhibiting an undesirable amount of variations in the completed gate structures. Such gate height variations can cause problems in device manufacturing, e.g., such a situation can make it more difficult to achieve and maintain planarity of subsequently deposited layers of material, it may result in conductive contacts being taller or shorter than anticipated, etc. The variations in gate height may be due to a variety of factors, e.g., the incoming silicon nitride gate cap material layer may have unacceptable thickness variations, the multiple CMP process operations that are performed in a typical replacement gate process flow can result in unacceptable levels of dishing, etc. Finding solutions to such problems is going to be even more important as device dimensions continue to shrink.

The present disclosure is directed to various embodiments of an integrated circuit product comprised of a gate registration structure that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of an integrated circuit product comprised of a gate registration structure. One illustrative device disclosed herein includes, among other things, first and second spaced-apart active regions defined in a semiconductor substrate that are separated by an isolation region positioned in the substrate, a first replacement gate structure positioned above the first active region, the first replacement gate structure having a first end surface, a second replacement gate structure positioned above the second active region, the second replacement gate structure having a second end surface and a gate registration structure positioned above the isolation region, wherein the gate registration structure comprises a layer of insulating material positioned above the isolation region and a polish-stop layer positioned on the layer of insulating material and wherein the first end surface of the first replacement gate structure abuts and engages a first side surface of the gate registration structure and the second end surface of the second replacement gate structure abuts and engages a second, opposite side surface of the gate registration structure.

BRIEF DESCRIPTION OF THE DRAWINGS

The disclosure may be understood by reference to the following description taken in conjunction with the accompanying drawings, in which like reference numerals identify like elements, and in which:

FIGS. 1A-1E depict one illustrative prior art method of forming a gate structure of the transistors using a so-called "replacement gate" technique.

Figure 2F:
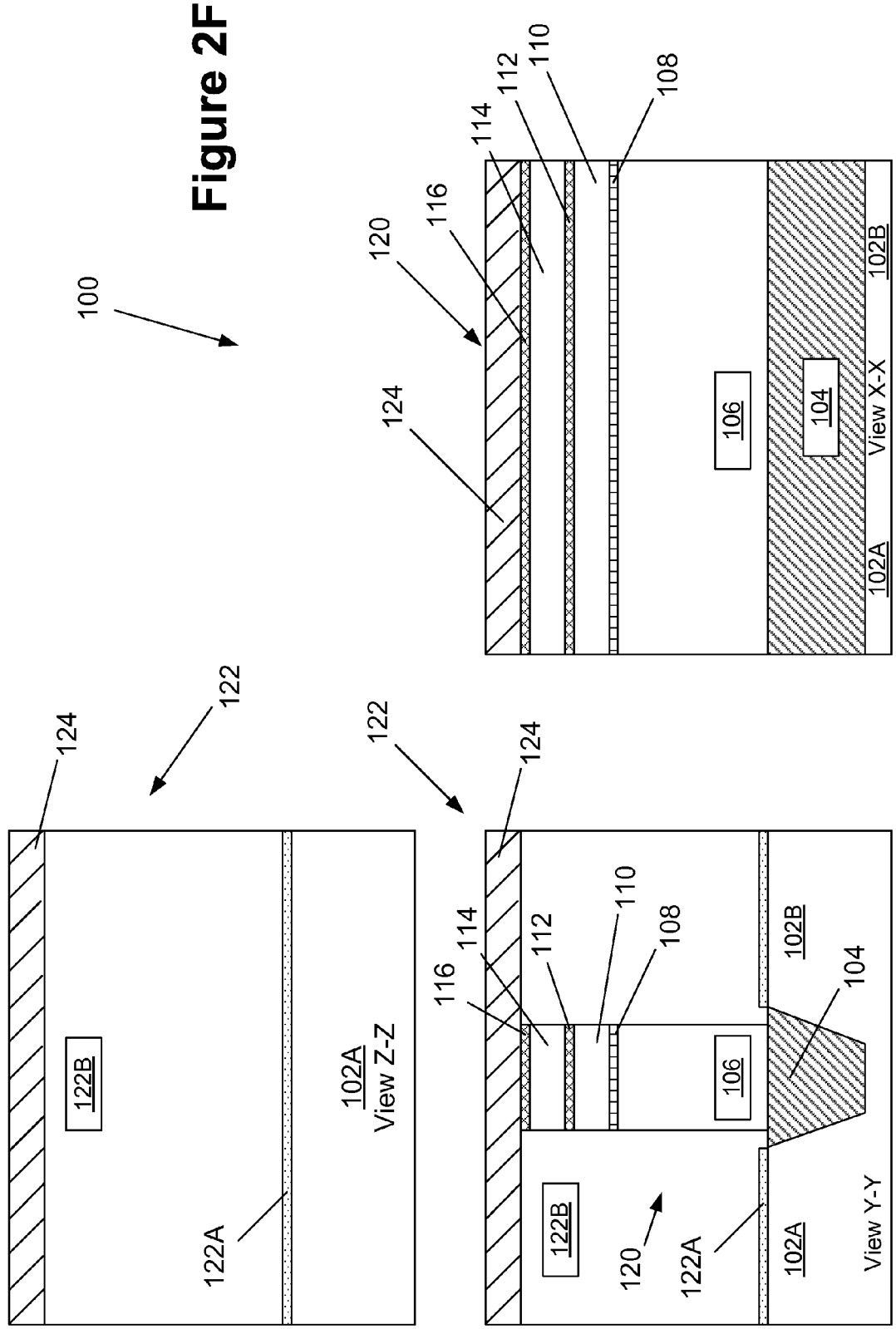
FIGS. 2A-2P depict various illustrative methods and structures for increasing height uniformity of replacement gate structures and the resulting integrated circuit products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various embodiments of an integrated circuit product comprised of a gate registration structure. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

FIGS. 2A-2P depict various illustrative methods and structures for increasing height uniformity of replacement gate structures and the resulting integrated circuit product. In general, FIG. 2A contains a plan view depicting where various cross-sectional views will be taken in the following drawings. The plan view in FIG. 2A depicts two spaced-apart active regions 102A, 102B that are separated by isolation material 104, and illustrative gate structures (depicted in dashed lines in FIG. 2A since they are not yet formed at this point in the process flow). With continuing reference to the plan view in FIG. 2A, the view "X-X" is a cross-sectional view taken through the isolation material 104 in a direction corresponding to the "gate-length" or current transport direction for the finished transistor devices formed above the active regions 102A, 102B. The view "Y-Y" is a cross-sectional view taken through the long axis of the gate structures formed above both of the active regions 102A, 102B, i.e., a cross-sectional view through the gate structures in the gate-width direction of the transistor devices. The view "Z-Z" is a cross-sectional view that is taken through what will become the source/drain (S/D) regions of the devices that are formed above both the active regions 102A, 102B. The various layers of material depicted in following drawings may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

As will be appreciated by those skilled in the art after a complete reading of the present application, the methods and structures disclosed herein may be used when forming either planar or 3D transistor devices. For purposes of explanation only, the inventions disclosed herein will be described in the context of forming illustrative planar FET devices. The transistor devices that are depicted in the attached drawings may be either NMOS or PMOS devices. Additionally, various doped regions, e.g., source/drain regions, halo implant regions, well regions and the like, are also not depicted in the attached drawings. The illustrative integrated circuit product 100 depicted in the drawings is formed above an illustrative substrate 102 that may have a variety of configurations, such as the depicted bulk silicon configuration. The substrate 102 may be made of silicon or it may be made of materials other than silicon. Thus, the terms "substrate" or "semiconductor substrate" should be understood to cover all semiconducting materials and all forms of such materials.

FIG. 2A depicts the product 100 at a point in fabrication wherein the spaced-apart active regions 102A, 102B were defined in the substrate 102 by the formation of isolation structures 104. The isolation structures 104 may be formed using well-known techniques, e.g., they may be trench isolation structures. The overall size of the active regions 102A, 102B may vary depending upon the particular application.

FIG. 2B depicts the product 100 after several layers of material 105 that will be used as part of a gate registration structure have been formed above the substrate 102. More specifically, first, second and third layers of insulating material 106, 110 and 114, respectively, as well as first, second and third polish-stop layers 108, 112 and 116 have been sequentially formed above the substrate 102. The layers of insulating material and the polish-stop layers may be formed from a variety of different materials, such as silicon dioxide, SiN, HfO$_2$, Al$_2$O$_3$, TiN, etc., and the decision as to which layers are made of which materials may vary depending upon the particular application. The layers of insulating material 106, 110, 114 need not all be made of the same insulating material, although such a scenario may occur in some applications. Similarly, the polish-stop layers 108, 112, 116 need not all be made of the same material, although such a scenario may occur in some applications. For example, polish-stop layers may be made of materials such as silicon nitride, hafnium oxide, aluminum oxide, diamond-like carbon, silicon-carbon, titanium nitride, etc., and the thickness of such layers of material may vary depending upon the particular application.

FIG. 2C depicts the integrated circuit product 100 at a point in fabrication after one or more anisotropic etching processes were performed through a patterned etch mask (not shown) on the structure of materials 105 to thereby define a gate registration structure 120 positioned above the isolation region 104. The patterned masking layer was removed after the materials 105 were patterned to define the gate registration structure 120. Note that, in the depicted example, the gate registration structure 120 is positioned only above the isolation region 104, i.e., it is not positioned above either of the active regions 102A, 102B.

The next major process operation involves formation of a replacement gate structure 122 on the product 100. Accordingly, FIG. 2D depicts the product 100 at a point in fabrication after the formation of various layers of material that will ultimately be patterned to form the sacrificial gate structure 122. More specifically, in the depicted example, the replacement gate structure 122 includes an illustrative sacrificial layer of insulating material 122A and an illustrative layer of sacrificial gate electrode material 122B. In this example, the dummy or sacrificial gate insulating layer 122A may be comprised of, for example, silicon dioxide, and the sacrificial or dummy gate electrode 122B may be comprised of, for example, polysilicon or amorphous silicon.

FIG. 2E depicts the product 100 after at least one first chemical mechanical polishing (CMP) process operation was performed to remove the portions of the material for the dummy gate electrode 122B that are positioned above the third polish-stop layer 116 of the gate registration structure 120. In this first CMP process, the third polish-stop layer 116 acts as a polish-stop layer.

FIG. 2F depicts the product 100 after a layer 124 of gate cap material was blanket-deposited on the product 100. In one illustrative embodiment, the gate cap material 124 may be comprised of a material such as silicon nitride, and it may be formed to any desired thickness.

Figure 2G:
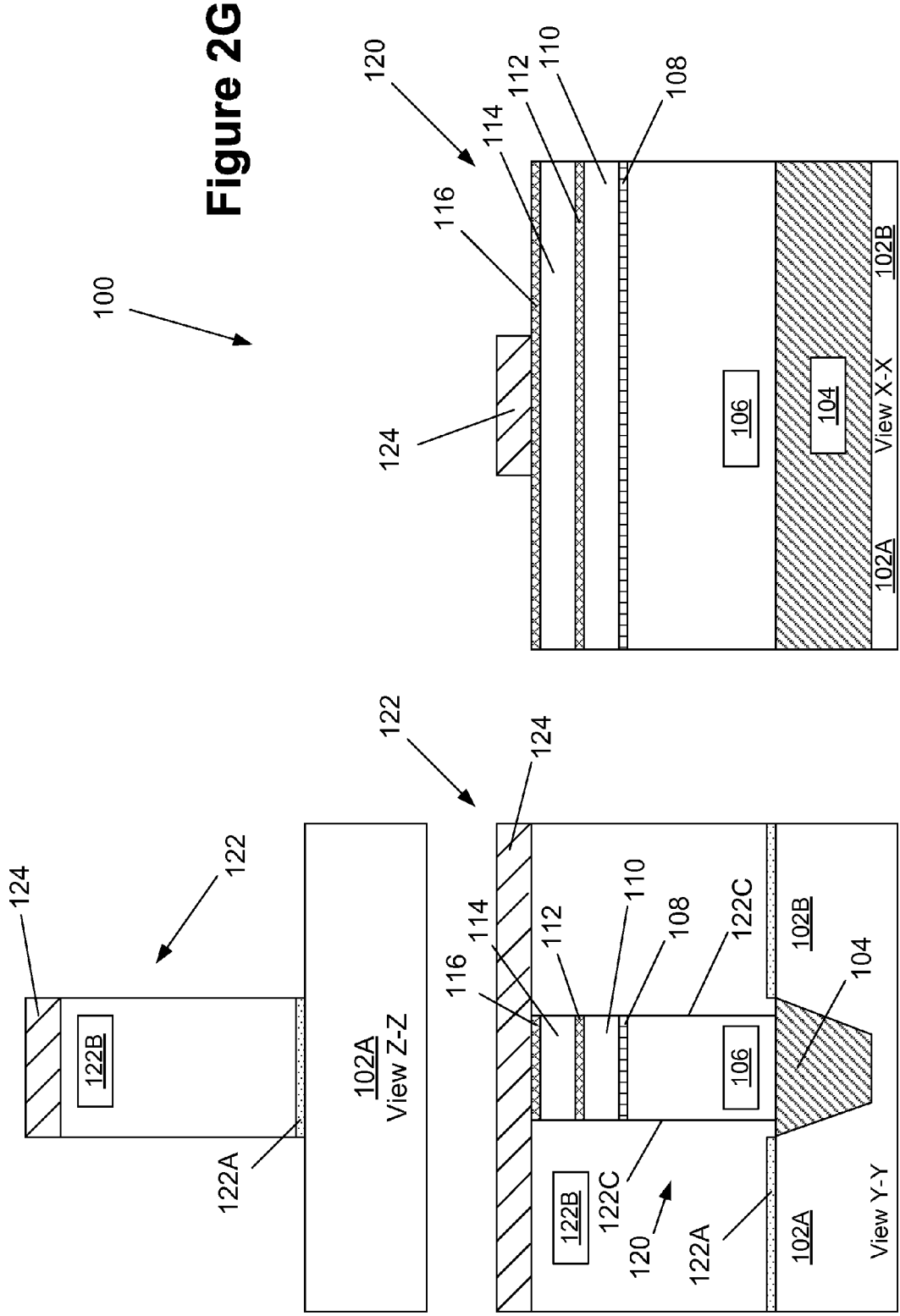

FIG. 2G depicts the product 100 after one or more etching processes were performed through a patterned masking layer (not shown), such as a patterned layer of photoresist, on the various layers of material to thereby define the patterned replacement gate structure 122, which is best depicted in view Z-Z. The gate cap layer 124 is positioned above the replacement gate structure 122. As shown in view Y-Y, the end surfaces 122C of at least the dummy gate electrode 122B abut and engage the gate registration structure 120 at this point in the process flow. In the depicted example, the end surfaces 122C of at least the dummy gate electrode 122B abut and engage all of the layers of material of the gate registration structure 120.

FIG. 2H depicts the product 100 after several process operations were performed. First, illustrative sidewall spacers 126 were formed adjacent the side surfaces (that run in the gate width direction of the transistor device) of the sacrificial gate structure 122. Since the end surfaces 122C of the dummy gate electrode 122B are in contact with the gate registration structure 120 at this point, the sidewall spacers do not form on the end surfaces 122C of the dummy gate electrode 122B. The spacers 126 may be formed by depositing a layer of spacer material, e.g., silicon nitride, and thereafter performing an anisotropic etching process. Next, epi semiconductor material 128 was deposited in the source/drain regions of the device. In some cases, cavities (not shown) may be formed in the substrate 102 prior to the formation of the epi semiconductor material 128. Of course, the formation of such epi semiconductor material 128 may not be required in all applications. At this point in the process flow, when viewed from above, the gate registration structure 120 is essentially a ring-like structure positioned around the perimeter of the active regions 102A, 102B and the sacrificial gate structures are line-type structures positioned above the active regions.

FIG. 2I depicts the product 100 after a layer of insulating material 130 was deposited on the product 100. The layer of insulating material 130 may be comprised of a variety of different materials, e.g., silicon dioxide, and it may be formed using a CVD process.

Next, as shown in FIG. 2J, one or more second CMP process operations were performed to expose the upper surface 122X of the dummy gate electrode 122B. During this CMP process, the gate cap layers 124 are removed. During the second CMP process(es), the third polish-stop layer 116 of the gate registration structure 120 acts as a polish-stop layer. Note that, after this process is completed, the exposed upper surfaces 122X of the sacrificial gate structure 122 is substantially planar with the third polish-stop layer 116 of the gate registration structure 120 (see view Y-Y).

FIG. 2K depicts the product 100 after one or more etching processes were performed to remove the sacrificial gate structure 122 and thereby define a replacement gate cavity 132 where a replacement gate structure will ultimately be formed. Of course, the sacrificial gate insulation layer 122A may not be removed in all applications. Even in cases where the sacrificial gate insulation layer 122A is intentionally removed, there will typically be a very thin native oxide layer (not shown) that forms on the substrate 102 within the gate cavity 132. The third polish-stop layer 116 is still depicted as being in existence at this point in the process flow. However, in practice, it may be the case that substantially all of the third polish-stop layer 116 may have been consumed by this point in processing operations. Note that, at this point in the process flow, portions of the gate registration structure 120 are exposed by the creation of the replacement gate cavity 132.

Figure 2L:
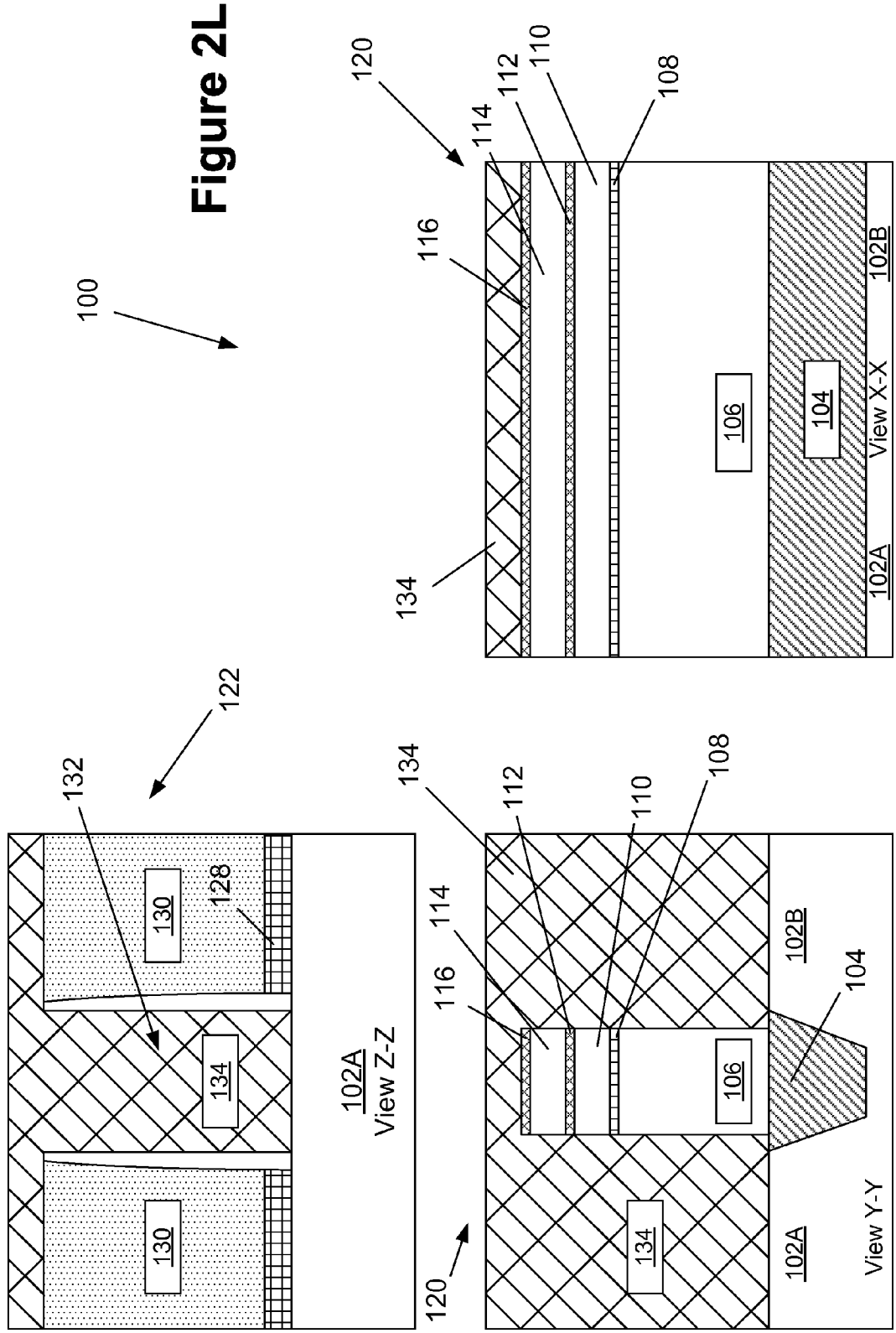

FIG. 2L depicts the product 100 after the schematically depicted materials 134 that will be used to manufacture the replacement gate structure for the transistor devices have been deposited on the product 100 and within the gate cavities 132. The replacement gate structure 134 that is described herein is intended to be representative in nature of any gate structure that may be formed on semiconductor devices using replacement gate techniques. Of course, the materials of construction used for the replacement gate structure 134 on a P-type device may be different than the materials used for the replacement gate structure 134 on an N-type device. In one illustrative embodiment, the schematically depicted materials for the replacement gate structure 134 include an illustrative gate insulation layer (not separately shown) and an illustrative gate electrode (not separately shown). The gate insulation layer may be comprised of a variety of different materials, such as, for example, silicon dioxide, a so-called high-k (k greater than 10) insulation material (where k is the relative dielectric constant), etc. Similarly, the gate electrode for the replacement gate structure 134 may also be made of a variety of conductive materials, such as one or more metal layers that act as the gate electrode. In one illustrative embodiment, a conformal CVD or ALD process may be performed to form a gate insulation layer comprised of a high-k layer of insulating material, $HfO_2$, $Al_2O_3$, etc. Thereafter, one or more metal layers (that will become the gate electrode) may be deposited above the product 100 and in the gate cavities 132.

FIG. 2M depicts the product 100 after one or more third CMP process operations were performed wherein the second polish-stop layer 112 of the gate registration structure 120 acts as a polish-stop layer during the third CMP process(es) operation. This process operation results in the removal of any remaining portions of the third polish-stop layer 116, the third layer of insulating material 114 and the materials of the replacement gate structure 134 that are positioned outside of the gate cavity 132 and above the layer of insulating material 130. Note that this process operation results in a reduced-height gate registration structure 120, wherein the second polish-stop layer 112 is the uppermost layer of the gate registration structure 120 (see view Y-Y). As shown in view Y-Y, the end surfaces 134A of the two replacement gate structures 134 abut and engage opposite sides of the gate registration structure 120 at this point in the process flow. In practice, it will typically be the high-k gate insulation layer (not separately shown) of the replacement gate structures 134 that will actually engage the gate registration structure 120. Also note that, after this process is completed, the exposed upper surface 134X of the replacement gate structures 134 is substantially planar with the second polish-stop layer 112 of the gate registration structure 120 (see view Y-Y).

FIG. 2N depicts the product 100 after one or more recess etching processes were performed to remove upper portions of the various materials of the replacement gate structure 134 within the gate cavity 132 so as to form a recess 135 within the gate cavity 132.

FIG. 2O depicts the product 100 after a layer 136 of a gate cap material was deposited above the product 100 and in the recesses 135. The gate cap material layer 136 is typically comprised of a material such as silicon nitride. The gate cap layer 136 is formed so as to protect the underlying gate materials during subsequent processing operations.

FIG. 2P depicts the product 100 after one or more fourth CMP process operations were performed wherein the first polish-stop layer 108 of the gate registration structure 120 acts as a polish-stop layer. This process operation results in the removal of any remaining portions of the second polish-stop layer 112, the second layer of insulating material 110 and the portions of the gate cap material layer 136 positioned outside of the gate cavity 132 and above the layer of insulating material 130. Note that this process operation results in a final gate cap 136 that is positioned above the replacement gate structures 134 and abuts the sidewall spacers 126 so as to thereby encapsulate the final replacement gate structure 134. The final gate cap layers 136 abut and engage the first polish-stop layer 108 and opposite sides of the gate registration structure 120, e.g., the first layer of insulating material 106. Also note that the fourth CMP process(es) leaves a further reduced-height gate registration structure 120, wherein the first polish-stop layer 108 is the uppermost layer of the gate registration structure 120 (see view Y-Y). As shown in view Y-Y, the end surfaces 134A of the two final replacement gate structures 134 abut and engage opposite sides of the gate registration structure 120 at this point in the process flow. In practice, it will typically be the high-k gate insulation layer (not separately shown) of the two replacement gate structures 134 (each of which is formed separate on isolated active regions) that will actually engage the gate registration structure 120. Note that, after this process is completed, the upper surface of each of the gate cap layers 136 is substantially planar with the first polish-stop layer 108 of the gate registration structure 120 (see view Y-Y). At this point in the process flow, traditional manufacturing processes may be performed to complete the fabrication of the product, e.g., formation of contacts and metallization layers, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   first and second spaced-apart active regions of a semiconductor substrate that are separated by an isolation region positioned in said substrate;
   a first replacement gate structure positioned above said first active region, said first replacement gate structure having a first end surface;
   a second replacement gate structure positioned above said second active region, said second replacement gate structure having a second end surface; and
   a gate registration structure positioned above said isolation region, wherein said gate registration structure comprises:
      a layer of insulating material positioned above said isolation region, said layer of insulating material having an upper surface and first and second sidewall surfaces located on respective first and second opposing sides of said gate registration structure; and
      a polish-stop layer positioned on and covering an entirety of said upper surface of said layer of insulating material, said polish-stop layer having an upper surface and first and second sidewall surfaces located on said respective opposing first and second sides of said gate registration structure, wherein said first end surface of said first replacement gate structure abuts and contactingly engages said first sidewall surface of said layer of insulating material of said gate registration structure and said second end surface of said second replacement gate structure abuts and contactingly engages said second sidewall surface of said layer of insulating material of said gate registration structure.

2. The integrated circuit product of claim 1, further comprising first and second gate cap layers positioned above said first and second replacement gate structures, respectively, wherein said first and second gate cap layers abut and contactingly engage at least said respective first and second sidewall surfaces of said polish-stop layer of said gate registration structure.

3. The integrated circuit product of claim 2, wherein said first and second gate cap layers further abut and contactingly engage said respective first and second sidewall surfaces of said layer of insulating material of said gate registration structure.

4. The integrated circuit product of claim 1, wherein said gate registration structure is positioned only above said isolation region and not above either of said first and second spaced-apart active regions.

5. The integrated circuit product of claim 1, wherein each of said first and second replacement gate structures have first sidewall surfaces that extend in a direction substantially parallel to a long axis of said first and second replacement gate structures and said integrated circuit product further comprises sidewall spacers positioned only along first sidewalls of said first and second replacement gate structures.

6. The integrated circuit product of claim 1, wherein said first and second replacement gate structures are each comprised of a layer of high-k insulating material and at least one layer of metal.

7. An integrated circuit product, comprising:
   first and second spaced-apart active regions of a semiconductor substrate that are separated by an isolation region positioned in said substrate;
   a first replacement gate structure positioned above said first active region, said first replacement gate structure having a first end surface;
   a second replacement gate structure positioned above said second active region, said second replacement gate structure having a second end surface;
   first and second gate cap layers positioned above said first and second replacement gate structures, respectively, and
   a gate registration structure this is positioned only above said isolation region and not above either of said first and second spaced-apart active regions, wherein said gate registration structure comprises:
      a layer of insulating material positioned above said isolation region, said layer of insulating material having an upper surface and first and second sidewall surfaces located on respective first and second opposing sides of said gate registration structure; and
      a polish-stop layer positioned on said upper surface of said layer of insulating material, said polish-stop layer having an upper surface and first and second sidewall surfaces located on said respective opposing first and second sides of said gate registration structure, wherein said first end surface of said first replacement gate structure abuts and contactingly engages said first sidewall surface of said layer of insulating material of said gate registration structure and said second end surface of said second replacement gate structure abuts and contactingly engages said second sidewall surface of said layer of insulating material of said gate registration structure, wherein said first and second gate cap layers abut and contactingly engage at least said respective first and second sidewalls of said polish-stop layer of said gate registration structure.

8. The integrated circuit product of claim 7, wherein said first and second gate cap layers further abut and contactingly engage said respective first and second sidewalls of said layer of insulating material of said gate registration structure.

9. The integrated circuit product of claim 8, wherein each of said first and second replacement gate structures have first sidewall surfaces that extend in a direction substantially parallel to a long axis of said first and second replacement gate structures and said integrated circuit product further comprises sidewall spacers positioned only along first sidewalls of said first and second replacement gate structures.

10. An integrated circuit product, comprising:
first and second spaced-apart active regions of a semiconductor substrate that are separated by an isolation region positioned in said substrate;
a first replacement gate structure positioned above said first active region, said first replacement gate structure having a first end surface;
a second replacement gate structure positioned above said second active region, said second replacement gate structure having a second end surface;
first and second gate cap layers positioned above said first and second replacement gate structures, respectively; and
a gate registration structure positioned above said isolation region, wherein said gate registration structure comprises:
a layer of insulating material positioned above said isolation region, said layer of insulating material having an upper surface and first and second sidewall surfaces located on respective first and second opposing sides of said gate registration structure; and
a polish-stop layer positioned on said upper surface of said layer of insulating material, said polish-stop layer having an upper surface and first and second sidewall surfaces located on said respective opposing first and second sides of said gate registration structure, wherein said first end surface of said first replacement gate structure abuts and contactingly engages said first sidewall surface of said layer of insulating material of said gate registration structure and said second end surface of said second replacement gate structure abuts and contactingly engages said second sidewall surface of said layer of insulating material of said gate registration structure, wherein said first and second gate cap layers abut and contactingly engage at least said respective first and second sidewalls of said polish-stop layer of said gate registration structure.

11. The integrated circuit product of claim 10, wherein said first and second gate cap layers abut and contactingly engage said respective first and second sidewalls of said layer of insulating material of said gate registration structure.

12. The integrated circuit product of claim 10, wherein said gate registration structure is positioned only above said isolation region and not above either of said first and second spaced-apart active regions.

13. The integrated circuit product of claim 12, wherein each of said first and second replacement gate structures have first sidewall surfaces that extend in a direction substantially parallel to a long axis of said first and second replacement gate structures and said integrated circuit product further comprises sidewall spacers positioned only along first sidewalls of said first and second replacement gate structures.

14. The integrated circuit product of claim 10, wherein said first replacement gate structure comprises a first replacement gate structure end portion having said first end surface and said second replacement gate structure comprises a second replacement gate structure end portion having said second end surface, said first replacement gate structure end portion extending across and covering a first upper surface portion of said isolation region and said second replacement gate structure end portion extending across and covering a second upper surface portion of said isolation region.

15. The integrated circuit product of claim 10, wherein a height level of said upper surface of said layer of insulating material of said gate registration structure above an upper surface of said isolation region is greater than a height level of an upper surface of said first and second replacement gate structures above said upper surface of said isolation region, and wherein said upper surface of said polish-stop layer is substantially co-planar with an upper surface of said first and second gate cap layers.

16. The integrated circuit product of claim 1, wherein said first replacement gate structure comprises a first replacement gate structure end portion having said first end surface and said second replacement gate structure comprises a second replacement gate structure end portion having said second end surface, said first replacement gate structure end portion extending across and covering a first upper surface portion of said isolation region and said second replacement gate structure end portion extending across and covering a second upper surface portion of said isolation region.

17. The integrated circuit product of claim 1, wherein a height level of said upper surface of said layer of insulating material of said gate registration structure above an upper surface of said isolation region is greater than a height level of an upper surface of said first and second replacement gate structures above said upper surface of said isolation region.

18. The integrated circuit product of claim 1, wherein said upper surface of said polish-stop layer is substantially co-planar with an upper surface of said first and second gate cap layers.

19. The integrated circuit product of claim 7, wherein said first replacement gate structure comprises a first replacement gate structure end portion having said first end surface and said second replacement gate structure comprises a second replacement gate structure end portion having said second end surface, said first replacement gate structure end portion extending across and covering a first upper surface portion of said isolation region and said second replacement gate structure end portion extending across and covering a second upper surface portion of said isolation region.

20. The integrated circuit product of claim 7, wherein a height level of said upper surface of said layer of insulating material of said gate registration structure above an upper surface of said isolation region is greater than a height level of an upper surface of said first and second replacement gate structures above said upper surface of said isolation region, and wherein said upper surface of said polish-stop layer is substantially co-planar with an upper surface of said first and second gate cap layers.

* * * * *